US012666928B2

(12) United States Patent
Huang et al.

(10) Patent No.:   US 12,666,928 B2
(45) Date of Patent:     Jun. 23, 2026

(54) APPARATUS AND METHODS FOR THREE DIMENSIONAL RETICLE DEFECT SMART REPAIR

(71) Applicant: Taiwan Semiconductor Manufacturing Co., Ltd., Hsinchu (TW)

(72) Inventors: Po-Chien Huang, Hsinchu (TW); Chung-Hung Lin, Hsinchu (TW); Chih-Wei Wen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 974 days.

(21) Appl. No.: 17/389,188

(22) Filed: Jul. 29, 2021

(65) Prior Publication Data

US 2022/0285226 A1     Sep. 8, 2022

Related U.S. Application Data

(60) Provisional application No. 63/156,833, filed on Mar. 4, 2021.

(51) Int. Cl.
*H10P 74/20*         (2026.01)
*G03F 1/74*          (2012.01)
(Continued)

(52) U.S. Cl.
CPC .............. *H10P 74/203* (2026.01); *G03F 1/74* (2013.01); *G06T 7/0008* (2013.01); (Continued)

(58) Field of Classification Search
CPC . H01L 22/12; H01L 22/24; G03F 1/74; G06T 7/0008; G06T 2207/30148; G06T 2207/20084
See application file for complete search history.

(56) References Cited

U.S. PATENT DOCUMENTS 5,777,729 A  *  7/1998  Aiyer ................... G01N 21/956
                                             356/394
10,887,580 B2 *  1/2021  Kolchin ............... H04N 13/221
                        (Continued)

FOREIGN PATENT DOCUMENTS

CN          109142371 A  *  1/2019   ........ G01N 21/8851

*Primary Examiner* — Sumati Lefkowitz
*Assistant Examiner* — Michael Adam Shariff
(74) *Attorney, Agent, or Firm* — Seed IP Law Group

(57)                  ABSTRACT

One or more embodiments of the present disclosure describe an artificial intelligence assisted substrate defect repair apparatus and method. The AI assisted defect repair apparatus employs an object detection algorithm. Based on the plurality of images taken by detectors located at different respective positions, the detectors capture various views of an object including a defect. The composition information as well as the morphology information (e.g., shape, size, location, height, depth, width, length, or the like) of the defect and the object are obtained based on the plurality of images. The object detection algorithm analyzes the images and determines the type of defect and the recommends a material (e.g., etching gas) and the associated information (e.g., supply time of the etching gas, flow rate of the etching gas, etc.) for fixing the defect.

20 Claims, 11 Drawing Sheets

(51) Int. Cl.
  *G06T 7/00*  (2017.01)
  *H10P 74/00*  (2026.01)
(52) U.S. Cl.
  CPC .. *H10P 74/235* (2026.01); *G06T 2207/20081* (2013.01); *G06T 2207/20084* (2013.01); *G06T 2207/30148* (2013.01)

(56) References Cited

U.S. PATENT DOCUMENTS

| | | | |
|---|---|---|---|
| 2009/0206253 A1* | 8/2009 | Saito | G01N 23/2251 |
| | | | 250/307 |
| 2019/0131120 A1* | 5/2019 | Yamaguchi | C23C 16/45561 |
| 2020/0074619 A1* | 3/2020 | Marella | G01N 21/9501 |
| 2022/0113262 A1* | 4/2022 | Alvis | G01N 21/9501 |
| 2023/0152685 A1* | 5/2023 | Bauer | G03F 1/84 |
| | | | 430/5 |

* cited by examiner 400    116

400

116

110

400

401

E-beam

Etching gas  auto dilute

600 — 103

116

110

400

116

110

APPARATUS AND METHODS FOR THREE DIMENSIONAL RETICLE DEFECT SMART REPAIR

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are beneficial. In one example associated with lithography patterning, a photomask (or mask) to be used in a lithography process has a circuit pattern defined thereon and is to be transferred to wafers. The pattern on the mask needs to be more accurate and the lithography patterning is more sensitive to the mask defects for small feature sizes in the advanced technology nodes. Accordingly, a mask is repaired to eliminate defects and is further checked to validate the repaired defects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
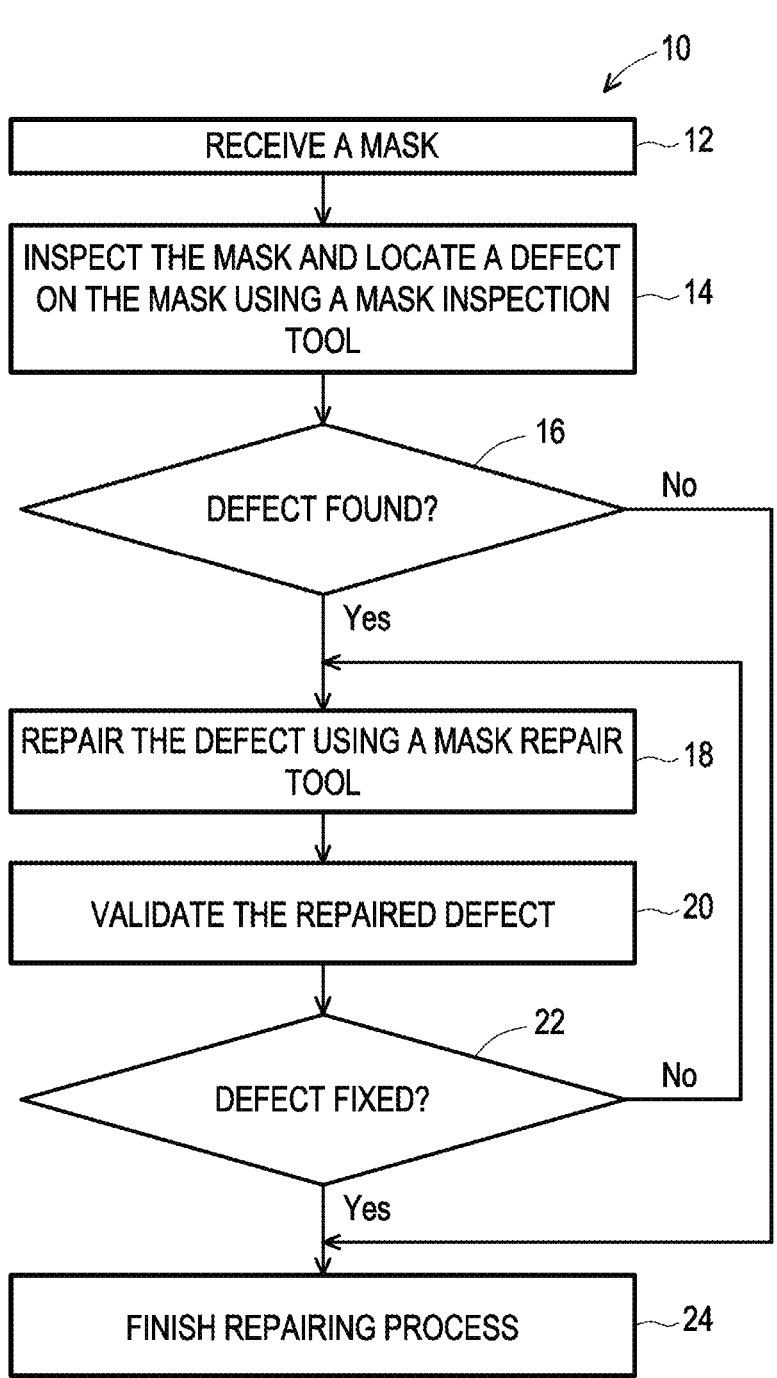
FIG. 1 is a flowchart of a method of repairing a defect in a substrate constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method of repairing a defect in a substrate constructed in accordance with some embodiments. The method 10 is described with reference to FIG. 1 and other figures. The method 10 may be used to repair any type of defect in a substrate. The substrate may refer to a wafer, a mask, a photo mask, or a reticle. A mask has been used as an example in this flowchart. However, the method is not necessarily limited to repairing a defect in a mask.

Referring to FIG. 1, the mask repairing may be implemented in a mask shop for making a mask, in a fab for fabricating a semiconductor device on a wafer using a mask, or in a glass factory for manufacturing a mask blanket. It is understood that additional steps can be provided before, during, and after the method 10, and some of the steps described can be replaced, eliminated, or moved around for additional embodiments of the method 10. The method 10 is only an example embodiment, and is not intended to limit the present invention beyond what is explicitly recited in the claims.

The method 10 begins at 12 by receiving or providing a mask. The mask is used to fabricate semiconductor wafers during lithography processes. The mask includes a substrate and a pattern formed on or to be formed on the substrate. The pattern is defined according to a circuit design. In some embodiments, a mask is a reflective mask to be used in an extreme ultraviolet (EUV) lithography.

The method 10 includes an operation 14 by inspecting the mask to identify a defect using a mask inspection tool, such as an optical inspection tool or an atomic force microscope (AFM). Inspecting the mask includes scanning a surface of the mask, locating a defect on the mask, and determining the shape and the size of the defect. As will be explained below, in some embodiments, the mask inspection tool includes electron-beam (or e-beam) defect repair apparatus. The e-beam defect repair apparatus inspects and detects defects on the mask. The e-beam defect repair apparatus includes a controller at least partially operated by an object detection model using artificial intelligence. This will be further detailed in the following figures.

The method 10 may proceed to an operation 16 by evaluating the mask inspection result. Evaluating the mask inspection may also include running a simulation to determine an impact of the defect on a resist pattern to be printed or formed on a wafer substrate. If the defect is small and within the specification (for example, the defect is smaller than about 3 nm in height or roughness), the mask is considered as defect free and the method 10 proceeds to 24 to finish the repairing process. If the defect is out of the specification, for example, larger than about 3 nm in height or roughness, the mask is considered to have a defect and the defect needs to be repaired. The defect determining process is determined using the AI object detection model. One example of this is the YOLO (You Only Look Once) model which is described in detail later. The YOLO model utilizes various images taken from various views to determine the type of defect and the dimension information of the defect (e.g., shape, size, location, height, depth, width, length, roughness, or the like).

The method 10 proceeds to an operation 18 by repairing the defect using a mask repairing tool. In some embodiments, repairing the defect includes using a radiation beam, such as an electron beam or an ion beam to heat the bump defect and smooth the bump defect and the surrounding area. In other embodiments, repairing the defect includes scooping the pit defect and depositing a patch by a deposition process, such as a chemical vapor deposition (CVD).

The controller included in the defect repair apparatus may also determine the type of defect and recommend and repair based on the type of defect identified. For example, the controller may determine the type of etchant gas, the supply duration of the etchant gas, flow rate of the etchant gas, auto-dilution timing of the etchant gas, or the like.

The method 10 proceeds to an operation 20 by validating the repaired defect that includes checking if the defect is fixed. In some embodiments, the validating includes performing a simulation process to evaluate the real impact of the repaired mask on a silicon wafer.

In some embodiments, the repaired defect includes acquiring aerial images of the repaired defect and the reference feature on an AIMS (Aerial Image Measurement System) tool by emulating an illumination condition of an exposing tool, applying an after development inspection (ADI) CD (critical dimension) target on the aerial image of the reference feature to get a target threshold, and measuring the CD on the aerial image of the repaired defect through focus. Performing the simulation also includes comparing the CD difference between the repaired defect and a reference feature.

In other embodiments, the validating includes acquiring diffraction image(s) of the repaired defect and the reference feature (e.g. a layout from a design database or a similar a defect-free feature on the mask) using a point source and evaluating the repaired defect based on the diffraction image(s). From the diffraction images, it is able to extract more information of the repaired defect to validating analysis. Particularly, 3 dimensional (3D) imaging data of a feature can be extracted from the diffraction images for more effective validating analysis.

A 3D effect of a feature on the mask can be described by two characteristic terms of a diffraction image of the feature, such as intensity (or amplitude) and numeric aperture (NA) position of different diffraction order from a pupil image. In some embodiments, a repaired feature on the mask is evaluated using the acquired or measured diffraction image of the repaired feature. Specifically, validating the repaired defect is executed by comparing diffraction images at various orders (DO images) between the repaired feature and the reference feature.

The method 10 proceeds to an operation 22 by evaluating if the defect is repaired. If the difference between the repaired feature and the reference feature is within predefined criteria, such as specification of a mask shop or a fab, the defect is considered to be repaired. If the difference between the repaired feature and reference is out of specification of the mask shop or the fab, the defect is not repaired. The mask needs to be reworked. For example, the mask goes back to operation 18 again by repairing the defect and then to operation 20 by performing a validating process on the repaired feature. This procedure may be repeated for a multiple times until the defect is repaired.

The method 10 proceeds to an operation 24 by finishing repairing process. Finishing repairing process may include applying an etching gas on the region where the defect is located within the mask (or reticle), mounting a frame and pellicle at pattern side of the mask to protect the pattern. Finishing repairing process may also include packing the mask and shipping the mask to a fab to fabricate an IC device.

Figure 2:
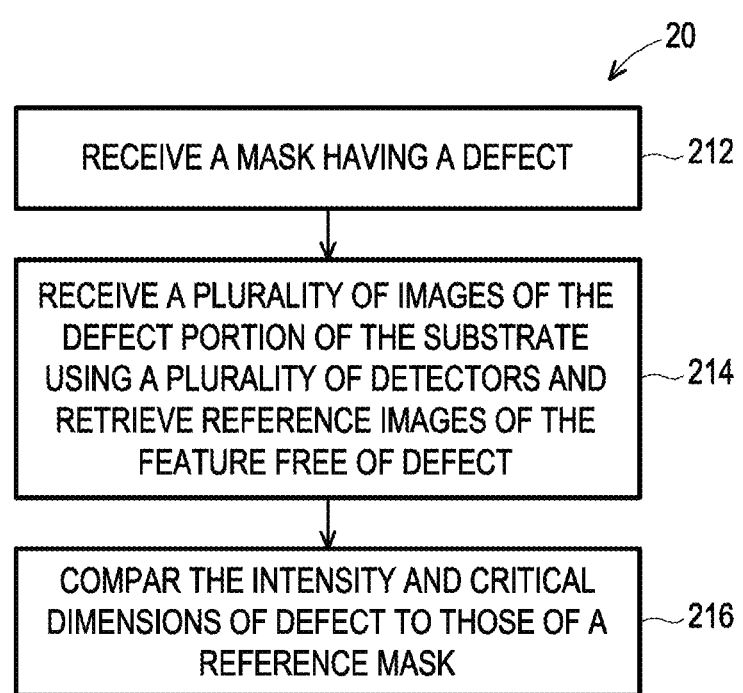
FIG. 2 is a flowchart of the operation (or method) described in accordance with some embodiments.

The operation (or method) 20 of the method 10 is further described with a flowchart in FIG. 2 according to one or more embodiments. The method 20 begins at 212 by receiving a repaired defect. The method 20 proceeds to a step 214 by receiving a plurality of images of the defect portion of the substrate using a plurality of defectors and retrieving reference images of the feature free of defect.

The method 20 includes a step 216 of comparing the intensities and critical dimensions of the defect to the respective intensities and dimensions (or critical dimensions) (e.g., shape, size, location, height, depth, width, length, roughness, or the like) of the reference image free of defect according to predefined criteria, such as a specification. If the differences of the respective intensities and the dimensions between the defect and the reference feature are within the specification, it is considered as repaired or valid repair. Otherwise, it is considered as not repaired or invalid repair.

Figure 3:
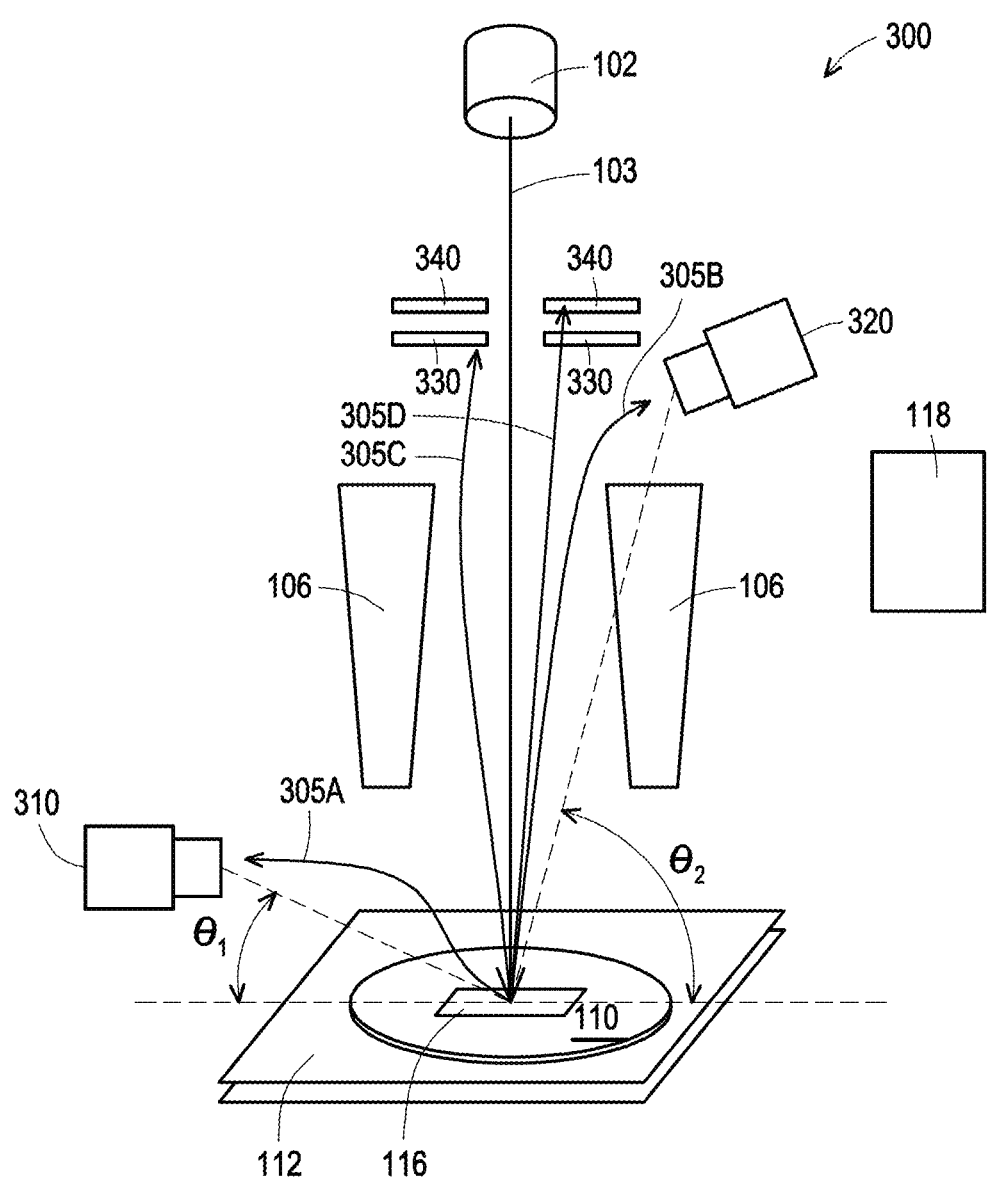
FIG. 3 illustrates a schematic view of a defect repair apparatus constructed according to some embodiments of the present disclosure.

FIG. 3 illustrates a schematic view of a defect repair apparatus 300 constructed according to some embodiments of the present disclosure. In some embodiments, the defect repair apparatus 300 is an electron-beam (or e-beam) defect repair apparatus 300 which utilizes an electron-based imaging to detect various types of defects in an integrated circuits (IC) patterning process. In some embodiments, the electron-beam defect repair apparatus 300 includes a scanning electron microscope (SEM) which is a type of electron microscope that produces images of an object (e.g., components, materials on a substrate, a wafer, mask, photo mask, reticle, or the like) by scanning the surface with a focused beam of electrons. The electrons interact with atoms in the object, producing various signals that contain information about the surface topography and composition of the object. The electron beam is scanned, for example, in a raster scan pattern, and the position of the beam is combined with the intensity of the detected signal to produce an image.

In FIG. 3, the electron-beam defect repair apparatus 300 is shown to include at least one secondary electrons (SE) detector 310, 320, 330 and at least one backscattered electrons (BSE) detector 340. The secondary electrons detector includes a lower detector 310, an upper detector 320, and an in-lens detector 330. A first detector may be referred to as the SE detector 310, a second detector may be referred to as the SE detector 320, a third detector may be referred to as the SE detector 330 (or in-lens detector 330), and a fourth detector may be referred to as the BSE detector 340. In one or more embodiments, the electron-beam defect repair apparatus 300 detects any defect on a photo mask which is also referred to as a mask, a photo mask, or a reticle and repairs the defect by providing various etching gases on the reticle.

The electron-beam defect repair apparatus 300 includes a particle source 102 to provide a particle beam. In the present embodiment, the particle source is an electron source and the particle beam is an electron beam. In furtherance of the embodiment, the source 102 is an electron gun with a mechanism to generate electrons, such as by thermal electron emission. In a particular example, the electron gun includes a tungsten (or other suitable material) filament designed and biased to thermally emit electrons. An electron beam 103 is illustrated as an electron beam from the source 102. For example, an e-beam 103 is generated by the e-beam source 102.

In some embodiments, the e-beam 103 from the e-beam source 102 may be further processed to have a proper beam spot and uniformity by various electron lenses.

The electron-beam defect repair apparatus 300 includes one or more lenses 106 to impact the electron incident beams 103 for imaging effect. In one embodiment, the lenses 106 includes a condenser lens to focus the electron beam 103 into smaller diameter, and further includes an objective lens properly configured. Various lenses, such as magnets, are designed to provide force to the electrons for proper imaging effect, such as focusing.

The electron-beam defect repair apparatus 300 also includes a deflector (not shown) to deflect an electron beam for scanning and exposing a certain region of a substrate in a certain mode, such as raster mode. In some embodiments, the substrate to be examined is a wafer, such as a silicon wafer, for integrated circuits. In some embodiments, the substrate to be examined is a reticle, a photo mask, or a mask. These subjects being examined may include one or more defects. The deflector is operable to direct an electron beam to the substrate 110 positioned on a stage 112. In one example, the deflector may include one or more coils to deflect the electron beam in two orthogonal directions such that the electron beam is scanned over a surface area of the substrate 110.

In the present embodiment, the substrate 110 is coated with a resist layer to be patterned in a lithography process. The resist layer includes a resist material which includes a component that resist to an IC fabrication process, such as etch and/or ion implantation. The resist material may be negative tone or positive tone. In one example, the resist material includes polymethyl methacrylate (PMMA).

In one embodiment, the stage 112 is operable to move such that an e-beam is directed to various locations of the resist layer on the substrate 110. In one example, the stage 112 and the deflector are designed to coordinately move the e-beam(s) relative to the substrate 110. Particularly, in the present embodiment, the substrate 110 includes a plurality of regions (fields) to be patterned. In the present embodiment, the e-beams 103 are controlled to examine the surface of the reticle.

Here, the e-beam is applied on the reticle or the substrate and when the e-beam contacts the surface of the reticle or the substrate, one or more signals are reflected. For instance, secondary electrons emitted by atoms excited by the electron beam are generated in the form of SE signals 305 and the SE signals 305 are detected using secondary electron detectors. In the figure, a first SE signal 305A is received at the lower detector 310, a second SE signal 305B is received at the upper detector 320, and a third SE signal 305C is received at the in-lens detector 330. Similarly, a BSE signal 305D is received at the BSE detector 340. The BSE signal 305D allows to determine element/component information (e.g., composition information about a particular element/component) about the substrate because the BSE signal 305D is dependent on what materials are in the substrate. For example, a BSE signal for a metal is relatively higher than a non-metal material. Further, the peak characteristic also helps in determining the type of material based on the BSE signal. For example, the peak of the signal will differ based on the type of material.

The SE signal, on the other hand, provides substrate morphology information. For example, the lower detector 310 which is positioned such that to receive reflected SE signals from the sides of the substrate, is capable of obtaining sidewall information related to the reticle.

The shape and the material of the object can be determined based on the combination of the SE detectors and the BSE detectors. In order to obtain the shape information not only from the top but also from the sides, the SE detectors are positioned at an angle $\theta$ between about 0 degrees to 75 degrees. For example, the lower detector 310 may be positioned at angle between about 0 degrees to 45 degrees and the upper detector 320 may be positioned at an angle between about 45 degrees to 75 degrees. The top view of the substrate can be taken by the in-lens detector 330 which is positioned above the substrate. For example, the in-lens detector 330 is positioned substantially perpendicular to the light path of the e-beam.

One non-limiting example of a secondary electron detector includes an Everhart-Thornley detector. The Everhart-Thornley Detector (E-T detector or ET detector) is a secondary electron and back-scattered electron detector used in scanning electron microscopes. The detector includes a scintillator inside a Faraday cage inside the specimen chamber of the microscope. A low positive voltage is applied to the Faraday cage to attract the relatively low energy (less than 50 eV by definition) secondary electrons. Other electrons within the specimen chamber are not attracted by this low voltage and may only reach the detector if their direction of travel takes them to it. The scintillator has a high positive voltage (in the nature of 10 kV) to accelerate the incoming electrons to it where they can be converted to light photons. The direction of their travel is focused to the light guide by a metal coating on the scintillator acting as a mirror. In the light pipe the photons travel outside of the microscope's vacuum chamber to a photomultiplier tube for amplification.

The E-T secondary electron detector can be used in the SEM's back-scattered electron mode by either turning off the Faraday cage or by applying a negative voltage to the Faraday cage. However, in other embodiments, a dedicated BSE detector may be used rather than from using the E-T detector as a BSE detector.

The number of secondary electrons that can be detected and the signal intensity at least partially depends on specimen topography. For example, the electron-beam defect repair apparatus 300 may achieve resolutions better than 1 nanometer.

Figure 4A:
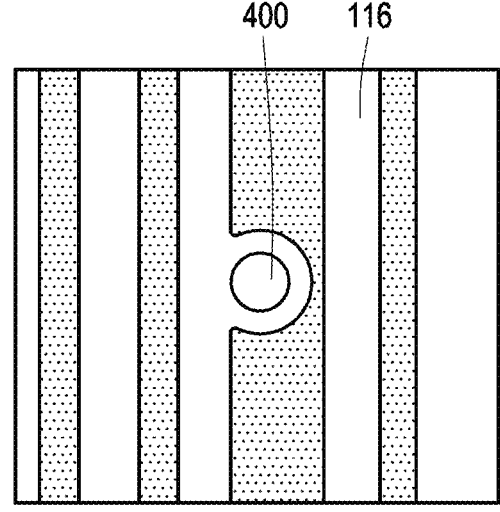
FIG. 4A illustrates a view taken above an object.
Figure 4B:
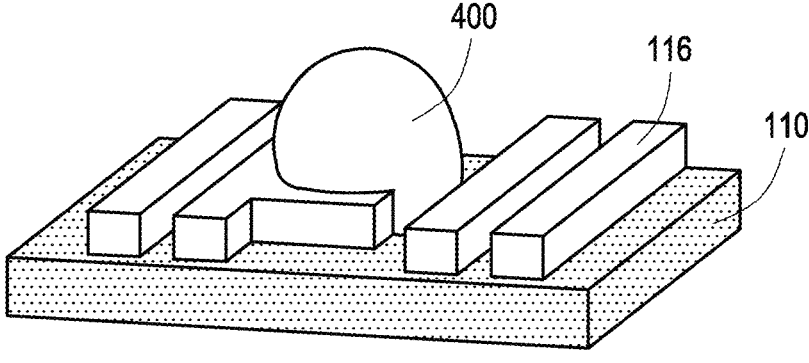
FIGS. 4B and 4C illustrate views taken from the sides of the object.
Figure 4C:
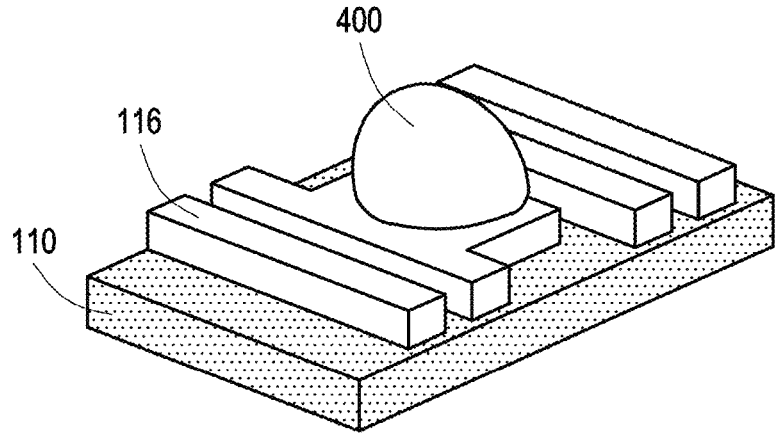
Figure 4D:
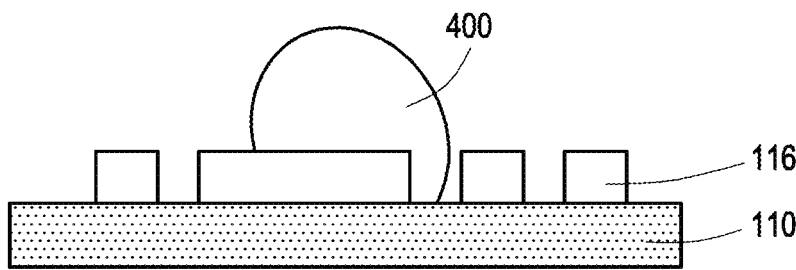
FIG. 4D illustrates a view taken from the direct side of an object.

Referring back to FIG. 3, a signal source 102 emits light signal (e.g., e-beam) to an object (in this case is the substrate 110). The first detector 310 is positioned at a first location and is configured to receive a first signal 305A reflected from the object. Because the first detector is laterally positioned from the object, the first detector is capable of receiving morphology information of the object and any defects on the object from the sides. FIG. 4D shows an example of images that may obtained from the first location.

In some embodiments, the first location forms a first inclination angle $\theta_1$ between a plane in which the object is on and an imaginary line from the object and the first detector. This first inclination angle $\theta_1$ may be between about 0 degrees to about 45 degrees. However, various acute angles may be set for the first inclination angle $\theta_1$ which allows to obtain the morphology of the sidewall as shown in FIGS. 4B, 4C, and 4D. That is, as long as the location of the first detector 310 does not overlap with the location of the lenses 106, the first inclination angle $\theta_1$ may have an angle greater than 45 degrees but less than about 75 degrees. Having the first detector 310 positioned at a first inclination angle $\theta_1$ greater than 75 degrees may limit the first detector 310 from obtaining morphology information from the side of the object.

The second detector 320 is positioned at a second location and is configured to receive a second signal 305B reflected from the object is configured to receive a second signal 305B reflected from the object. Because the second detector is relatively more vertically positioned from the object and the first detector, the second detector is capable of receiving morphology information of the object and any defects on the object from a view that that is similarly shown in FIGS. 4B and 4C. Based on the location of the second detector and its second inclination angle $\theta_2$, the second detector may not be able to produce an image as shown in FIG. 4A or 4D.

In some embodiments, a second inclination angle $\theta_2$ is formed between a plane in which the object is on and an imaginary line from the object and the second detector at the second location. This second inclination angle $\theta_2$ may be between about 30 degrees to about 75 degrees. However, various acute angles may be set for the second inclination angle $\theta_2$ which allows to obtain the morphology of the sidewall as shown for example in FIGS. 4B and 4C. That is, as long as the location of the second detector 320 does not overlap with the location of the lenses 106 and the third detector 330 and the fourth detector 340, the second inclination angle $\theta_2$ may have an angle even greater than about 75 degrees. However, due to the structural elements within the defect repair apparatus 300, positioning the second detector 320 greater than for example, about 80 degrees may overlap with the third detector 330 arranged opposite of the object.

The third detector 330 is positioned at a third location and is configured to receive a third signal 305C reflected from the object. The third detector 330 is positioned opposite of the object and is capable of obtaining a view similar to that shown in FIG. 4A. That is, because the third detector 330 is directly above the substrate, it can obtain a top view of the object. However, obtaining a morphology information based on a top view is beneficial in identifying the location and the two-dimensional size of the object and the defect. However, the three-dimensional shape of the defect, the height, depth, width, and length of the defect, and the roughness of the defect may not be obtained from the third detector 330 due to its arrangement within the defect repair apparatus.

The fourth detector 340 is positioned at a fourth location adjacent to the third detector 330 and is configured to receive a fourth signal 305D reflected from the object. The BSE signal 305D is used to determine composition information about the object and the defect. The BSE signal 305D is dependent on what materials are in the substrate. In particular, backscattered electrons (BSE) consist of high-energy electrons originating in the electron beam that are reflected or back-scattered out of the specimen interaction volume by elastic scattering interactions with specimen atoms. Since heavy elements (high atomic number) backscatter electrons more strongly than light elements (low atomic number), and thus appear brighter in the image, BSE signals are used to detect contrast between areas with different chemical compositions.

Dedicated backscattered electron detectors are positioned above the sample in a "doughnut" type arrangement (see FIG. 3), concentric with the electron beam, maximizing the solid angle of collection. BSE detectors are usually either of scintillator or of semiconductor types. Backscattered electrons can also be used to form an electron backscatter diffraction (EBSD) image that can be used to determine the crystallographic structure of the specimen.

The electron-beam defect repair apparatus 300 also includes a control module 118 integrated and coupled with various components of the electron-beam defect repair apparatus 300. The electron-beam defect repair apparatus 300 may further include other components and modules. In one example, the electron-beam defect repair apparatus 300 includes a module to check and monitor alignment and overlay during a lithography exposure process.

The control module 118 includes any electrical circuitry, features, components, an assembly of electronic components or the like. For example, the control module 118 may include any processor-based or microprocessor-based system including systems using microcontrollers, integrated circuit, chip, microchip, reduced instruction set computers (RISC), application specific integrated circuits (ASICs), field-programmable gate arrays (FPGAs), graphical processing units (GPUs), image processors, logic circuits, and any other circuit or processor capable of executing the various operations and functions described herein. Further, the control module 118 or the controller 118 may include AI assisted analysis module and an AI training module.

In some embodiments, the controller 118 which includes an image processor generates a three-dimensional image that contains morphology information and composition information based on the first, second, third, and fourth detectors. Each of the detectors among the plurality of detectors obtains image of the object and the defect from various locations within the apparatus 300.

The controller 118 receives various images from different views but the controller 118 may further allocate what portion of the signal source that the controller will be using to construct the image of the defect.

In one or more embodiments, the control module (or control circuit) 118 includes an AI module. The AI module identifies the type of defect in the reticle and suggests a suitable type of etching gas associated with the specific type of defect. The AI module determines how many repair loops (repair cycle, repair time) are needed to fix the defect. In the training stage of the AI module, various images collected from the apparatus 300 is used.

In some embodiments, the morphology information and composition information may be generated based on signals 305A obtained from the first detector (about 10 to 20%), signals 305B obtained from the second detector (about 10 to 20%), signals 305C obtained from the third detector (about 20 to 30%), and signals 305D obtained from the fourth detector (about 40 to 50%). That is, in order to obtain composition information of the object and the defect, about 40 to 50% of overall information is obtained through the BSD signals 305D. Further, in order to obtain morphology information from the lower sides (for example, having a first inclination angle about 0 to 45 degrees), about 10 to 20% of the information is obtained through the SE signals 305A and to obtain morphology information from the upper sides (for example, having a second inclination angle about 45 to 75 degrees), about 10 to 20% of the information is obtained through the SE signals 305B. In addition, to obtain morphology information from the top, about 20 to 30% of the information is obtained through the SE signals 305C. In one embodiment, about 15% of the information is obtained from the first detector 310, and about 15% of the information is obtained from the second detector 320, and about 25% of the information is obtained from the third detector 330, and about 45% of the information is obtained from the fourth detector 340.

In some embodiments, the accelerate voltage of the signal source (e.g., e-beam) may be adjusted to receive improved morphology information and composition information. For example, the aforementioned information based on the first to fourth detectors may be obtained with an accelerate voltage of the e-beam set at about 1 keV. A 1 keV accelerate voltage of the e-beam allows to analyze the object at a surface level. However, in order to obtain a deeper reticle defect morphology, the accelerate voltage of the e-beam may be set at about 3 keV. Accordingly, the information based on the first to fourth detectors may be obtained for a second time with an accelerate voltage of the e-beam set at about 3 keV. Having the accelerate voltage set at 3 keV allows to detect EUV undercut defect which may not be able to detect under the 1 keV accelerate voltage setting. For example, using 3 keV as an accelerate voltage for the e-beam allows to obtain deeper information inside the substrate (e.g., deeper than the surface of the substrate).

The controller 118 obtains morphology information and the composition information from the first to fourth detectors when the accelerate voltage of the e-beam is both at 1 keV and 3 keV. The image processor included in the controller 118 processes and reconstructs an image of the object having a defect containing the morphology information and the composition information. In other embodiments, the controller 118 analyzes the morphology information and the composition information obtained from the first to fourth detectors when the accelerate voltage of the e-beam is both at 1 keV and 3 keV and analyzes each information obtained from when the accelerate voltage is at about 1 keV and when the accelerate voltage is at about 3 keV without necessarily reconstructing to generate a 3D image-based model.

FIG. 4A illustrates a view taken above an object. As shown, FIG. 4A is a top view of a certain area of an object that is being captured. A defect 400 is shown on top of the object 110 and sidewalls 116. From the top, which may be an image taken from the third detector 330, the location of the defect 400 and the two-dimensional size of the defect 400 is obtained. However, from the top view alone, the three-dimensional shape of the defect 400, the height, depth, width, and length of the defect 400, and the roughness of the defect 400 may not be obtained from the third detector 330 due to its arrangement above the object 110.

FIGS. 4B and 4C illustrate views taken from the sides. As shown, FIGS. 4B and 4C are both side views but FIG. 4B is a side view taken at a lower height (or a lower inclination angle) than FIG. 4C. The critical dimensions of the defect 400 and the sidewalls 116 are better captured from the side views. That is, the dimension information of the defect 400 and the sidewalls 116 are obtained. For example, shape, size, height, depth, width, length, roughness of both the defect 400 and the sidewalls 116 can be determined. The second inclination angle of the second detector 320 may be adjusted to have various views depending on the second inclination angle.

FIG. 4D illustrates a view taken from the direct side of an object. As shown, FIG. 4D looks like as if it is a crosssectional view. FIG. 4D allows to appreciate the accurate height, depth, width of the defect 400 and the sidewalls 116. It also allows to appreciate the shape from a different angle and size, length, roughness of the defect 400 and sidewalls 116. The first inclination angle of the first detector 310 may be adjusted from 0 degrees to about 30 degrees to have various side views of the object 400 and the sidewalls 116.

Figure 5A:
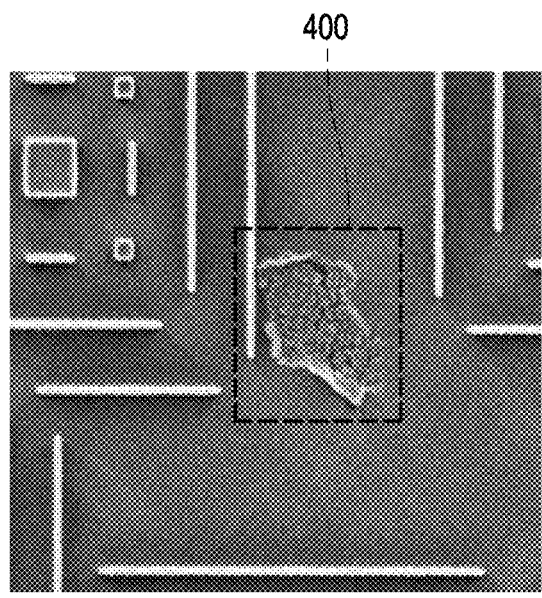
FIG. 5A illustrates a defect on an object.
Figure 5B:
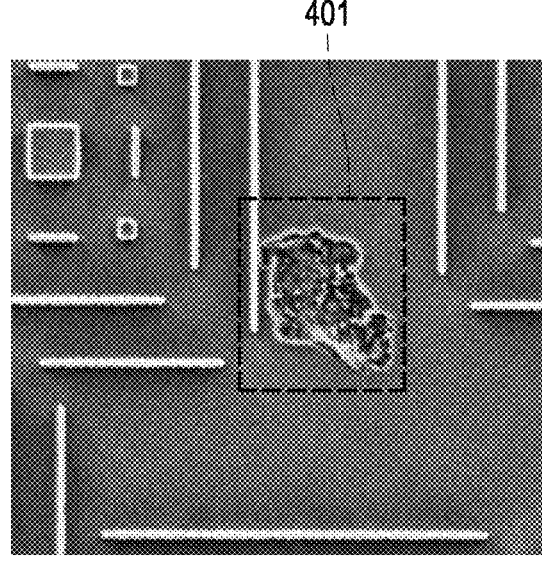
FIG. 5B illustrates a defect on the object that was over-etched.

FIG. 5A illustrates a defect on an object. FIG. 5B illustrates a defect on the object that was over-etched. In some approaches in the related art, the defect 400 on the object 110 (substrate, wafer, mask, reticle, photo mask, etc.) was identified from an in-lens detector positioned above the object. Accordingly, the defect was only identifiable based on the top view and there was the frequent problem of over-etching and damaging the object 110 as shown in FIG. 5B.

From the top, which may be an image taken from the third detector 330, the location of the defect 400 and the two-dimensional size of the defect 400 is obtained. However, from the top view alone, the three-dimensional shape of the defect 400, the height, depth, width, and length of the defect 400, and the roughness of the defect 400 may not be obtained from the third detector 330 due to its arrangement above the object 110.

According to some approaches in the related art, a trained engineer had to manually oversee the repair etching process because the dimension information of the defect such as height, depth, width, length, roughness could not be obtained. Even so, manual operation by the engineer may lead to misjudgment in the depth of the defect 400 or other dimensions and over-etch the defect 401. The etching gas used may not have been diluted timely and the object under the defect could be etched. If the object was a reticle, this over-etching would have resulted in a reticle scrap.

Figure 6A:
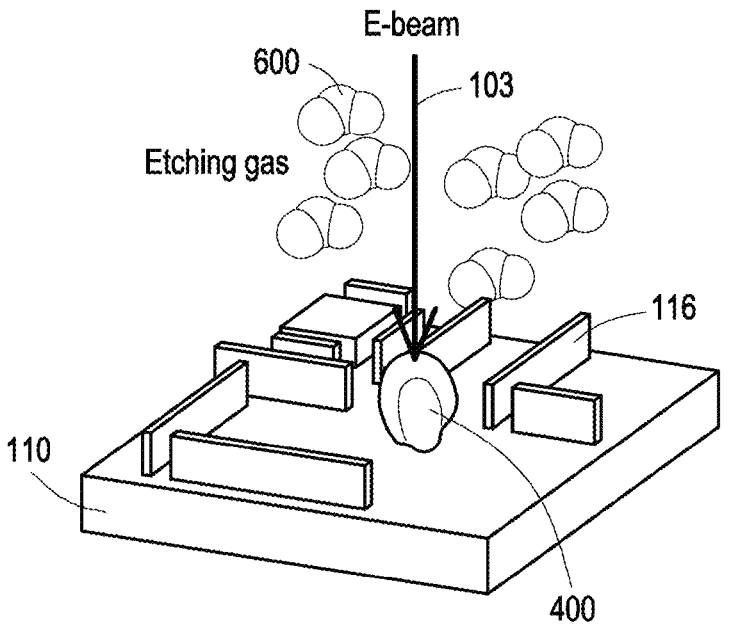
FIGS. 6A to 6D illustrate a process of repairing a defect according to some embodiments of the present disclosure.
Figure 6B:
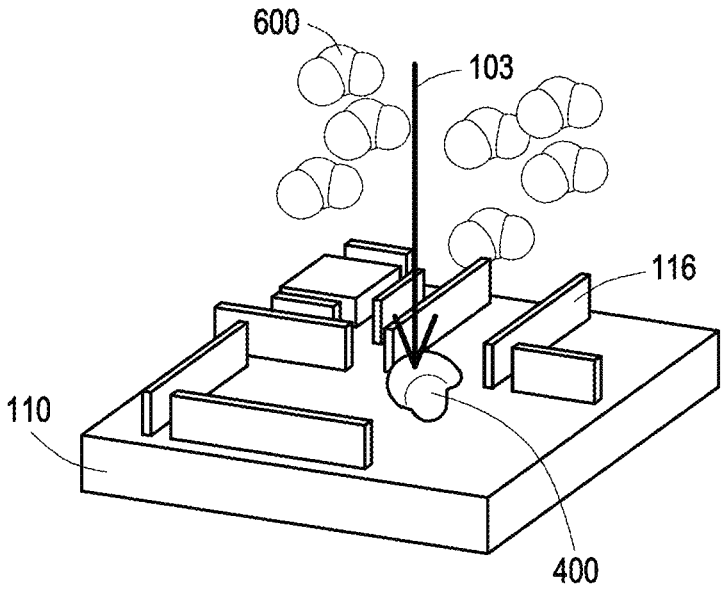
Figure 6C:
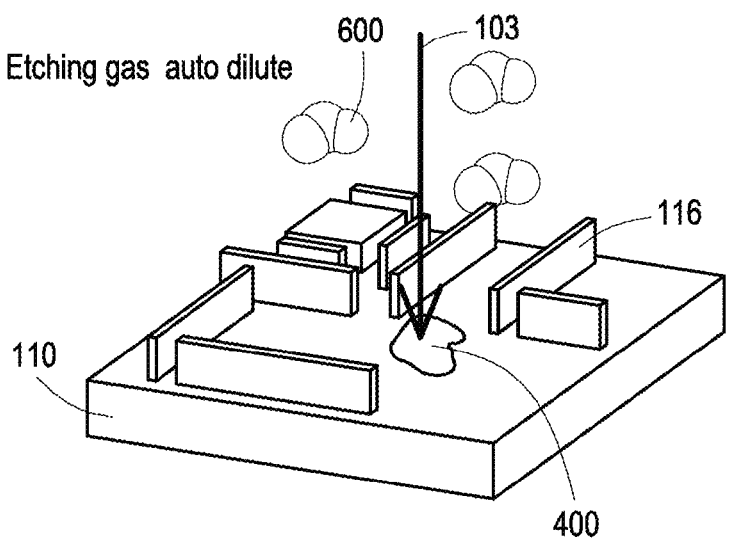

FIGS. 6A to 6D illustrate a process of repairing a defect according to some embodiments of the present disclosure. In FIG. 6A, a defect 400 on the object 110 is identified. Further, the type of the defect is also identified based on the object detection algorithm (including YOLO) using the controller. The controller provides an appropriate etching gas 600 for the particular type of defect and provides it within the apparatus 300. FIG. 6B shows that the size of the defect 400 is reducing as the etching gas reacts with the defect 400. FIG. 6C shows the size of the defect 400 significantly reduced and the controller transmits a signal to the gas outlet to dilute the concentration of the etching gas so that it does not over-etch the object underneath the defect 400. This process of auto-dilution of the etching gas is controlled by the controller using AI assisted algorithms.

Figure 6D:
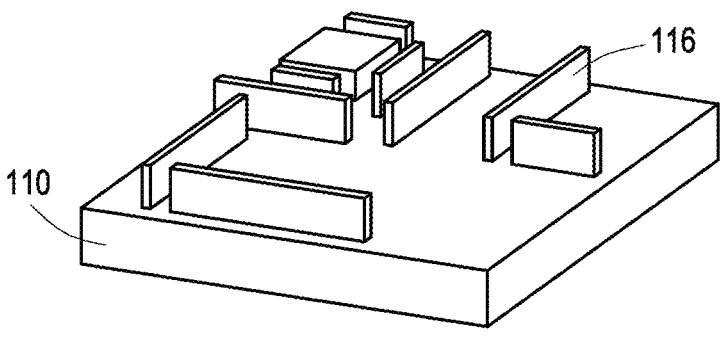

For example, a real-time defect repair may be conducted using the defect repair apparatus according to the present disclosure. The various images from the first to fourth detectors are obtained at, for example, over 10 images/sec. The 3D image calculation is performed by the AI object detection model implemented in the controller. The 3D image includes both the morphology information and the composition information and the controller predicts the best end-point (e.g., the boundary between the defect and the object) and auto stop the repair process. By the end of defect repair process, the etching gas will be auto diluted by Ar gas triggered by the controller. FIG. 6D shows an object (e.g., a reticle) with no over-etched damages on the object.

Figure 7:
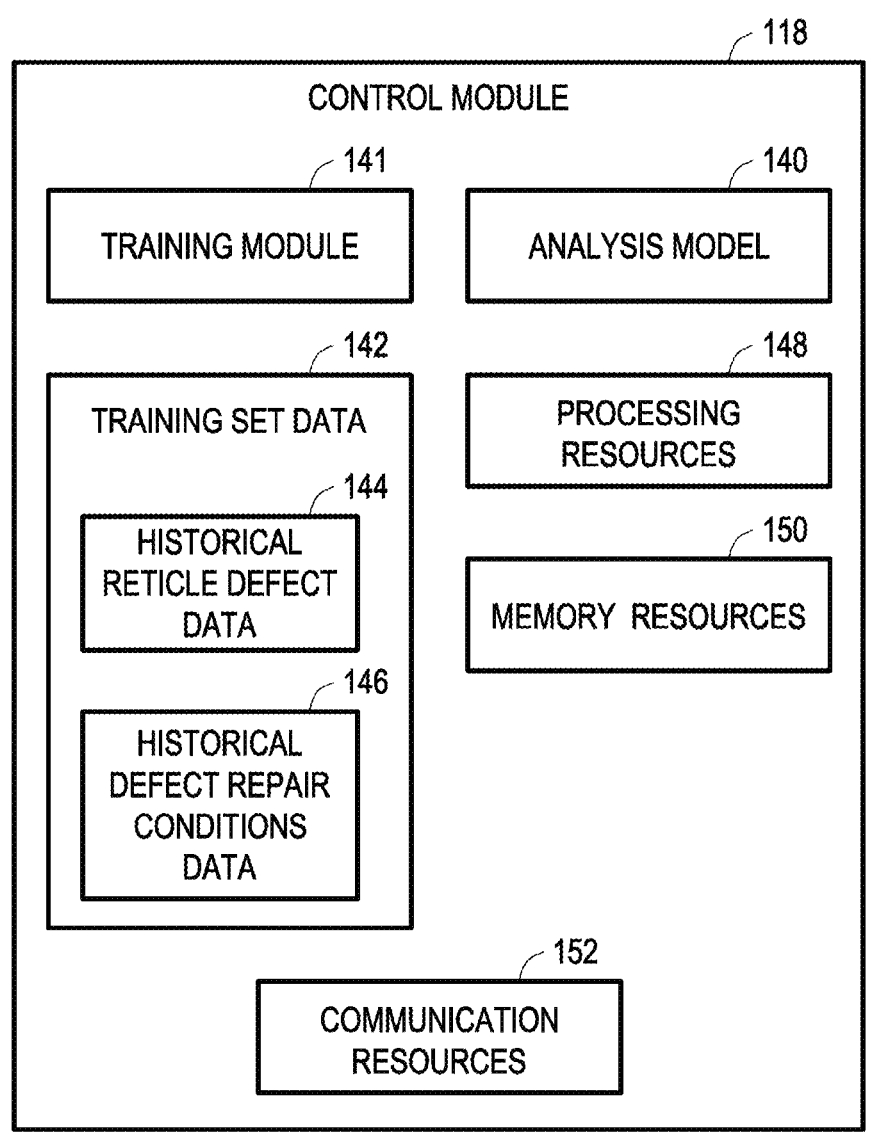
FIG. 7 is a block diagram of the control module 118, according to one embodiment.

FIG. 7 is a block diagram of the control module 118, according to one embodiment. The control module 118 of FIG. 7 is configured to control operation of a defect repair apparatus 300, according to one embodiment. The control module 118 utilizes object detection algorithms such as the YOLO model to adjust parameters of the defect repair apparatus 300. The control module 118 can adjust parameters of the defect repair apparatus 300 in order to ensure that the reticle being examined is repaired and the repaired reticle falls within selected specifications.

In one embodiment, the control module 118 includes an analysis model 140 and a training module 141. The training module trains the analysis model 140 with a machine learning process (e.g., YOLO model). The machine learning process trains the analysis model 140 to select repair parameters for a reticle defect repair process that will result in a repaired reticle having selected characteristics that falls within the selected specifications. Although the training module 141 is shown as being separate from the analysis model 140, in practice, the training module 141 may be part of the analysis model 140.

The control module 118 includes, or stores, training set data 142. The training set data 142 includes historical reticle defect data 144 and historical defect repair conditions data 146. The historical reticle defect data 144 includes data related to various types of reticle defects. The historical defect repair conditions data 146 includes data related to repair conditions during the defect repair processes. As will be set forth in more detail below, the training module 141 utilizes the historical reticle defect data 144 and the historical defect repair conditions data 146 to train the analysis model 140 with a machine learning process.

In one embodiment, the historical reticle defect data 144 includes data related to the type, dimension, location of an identified defect. For example, during operation of a semiconductor fabrication facility, thousands or millions of reticles may be processed over the course of several months or years. Each of the reticles are examined by a reticle engineer to see if a reticle defect is present. If a defect exists, the reticle engineer may label the defect type and mark the location in the obtained defect image. The historical reticle defect data 144 includes over several thousand reticle defect images and over at least 10 types of reticle defect. Accordingly, the historical reticle defect data 144 can include various types of reticle defects, the dimensions of the defect (e.g., shape, size, height, depth, width, length, roughness, or the like), and the locations of the defect.

In one embodiment, the historical reticle defect data 144 may also include data related to the thickness of a reticle defect by defect types. For example, the reticle defect may have a certain thickness and this thickness is beneficial in determining the boundary between the substrate (or in this case the reticle) and the defect. The historical reticle defect data 144 can include thickness data of the defect by its defect type so that when an etching gas is applied for the repair process, the etching gas is timely diluted after a certain repair period so that the reticle is not over-etched.

In one embodiment, the historical defect repair conditions data 146 include various process conditions or parameters during repair process associated with the historical reticle defect data 144. Accordingly, for each reticle defect information in the historical reticle defect data 144, the historical defect repair conditions data 146 can include the process conditions or parameters that were present during repair of the reticle defect. For example, the historical defect repair conditions data 146 can include data related to the type of repair gas (e.g., etchant gas, deposition gas), flow rates of repair gas (e.g., reticle etchant flow, etch-stop gas flow, pattern-grow gas flow, or the like), repair recipe for each type of reticle defect, and repair gas supply time, etc.

The historical defect repair conditions data 146 can include data related to controlling the repair gas flow based on how much reticle defect is remained on the reticle. For example, by receiving real-time 2D and 3D images of the reticle defect (including morphology information and composition information), the controller can adjust the repair gas flow based on the updated real time images. For example, the historical defect repair conditions data 146 can include repair gas flow adjustment data so that the gas flow is reduced when the repair process is near the end or completion.

In one embodiment, the training set data 142 links the historical reticle defect data 144 with the historical defect repair conditions data 146. In other words, various types of reticle defects, the dimensions of the defects including shape, size, height, depth, width, length, roughness, and the locations of the defect within the reticle in the historical reticle defect data 144 is linked to the repair conditions data associated with that repair process for that particular defect type. As will be set forth in more detail below, the labeled training set data can be utilized in a machine learning process to train the analysis model 140 to predict semiconductor process conditions that will result in properly formed thin films.

In one embodiment the analysis model 140 includes an object detection network such as a You Only Look Once (YOLO) algorithm. Object detection is a computer technology related to computer vision and image processing that deals with detecting instances of semantic objects of a certain class (such as objects, humans, buildings, or cars) in digital images and videos. Object detection has applications in many areas of computer vision, including object retrieval in an image. Every object class has its own special features that helps in classifying the class (for example, all circles are round). Object class detection uses these special features. For example, when looking for circles, objects that are at a particular distance from a point (e.g., the center) are sought. Similarly, when looking for squares, objects that are perpendicular at corners and have equal side lengths are needed. A similar approach is used for reticle defects. Defects of certain types have certain shape, size, roughness, and location and other features. These various features of reticle defects are classified under a class under the YOLO model which enables the YOLO to identify and classify various types of reticle defects under certain classes. "YOLOv3: An Incremental Improvement" by Joseph Redmon and Ali Farhadi is incorporated herein in its entirety as a reference.

Training of the analysis model 140 will be described in relation to an object detection network. Any object detection network including R-CNN, Fast R-CNN, Faster R-CNN, cascade R-CNN, Single Shot MultiBox Detector (SSD), You Only Look Once (YOLO), Single-Shot Refinement Neural Network for Object Detection (RefineDet), Retina-Net, and Deformable convolutional networks. However, other types of analysis models or algorithms can be used without departing from the scope of the present disclosure.

The training module 141 utilizes the training set data 142 to train the object detection network with a machine learning process. During the training process, the object detection network receives, as input, historical defect repair conditions data 146 from the training set data. During the training process, the object detection network outputs predicted treatment (or clean recipe or repair recipe) for the reticle defect (e.g., defect type, etching gas or deposition gas needed to repair the defect, etching gas auto-dilution time, reticle etchant flow rate, etch-stop gas flow rate, pattern-grow-gas flow rate, etc.). The predicted clean recipe data predicts characteristics of a type of reticle defect that would result from the historical defect repair conditions data. The training process trains the object detection network to generate predicted defect type and a predicted clean recipe data that can repair the predicted defect type. The predicted clean recipe data can include chemicals needed for cleaning the reticle or other cleaning condition parameters. Similarly, the predicted repair recipe data predicts characteristics of a type of reticle defect that would result from the historical defect repair conditions data. The training process trains the object detection network to generate predicted defect type and a predicted repair recipe data that can repair the predicted defect type. The predicted repair recipe data can include etching gas or deposition gas needed to repair the defect, etching gas auto-dilution time, reticle etchant flow rate, etch-stop gas flow rate, pattern-grow-gas flow rate, or other repair condition parameters.

In one embodiment, the object detection network includes a plurality of neural layers. The various neural layers include neurons that define one or more internal functions. The internal functions are based on weighting values associated with neurons of each neural layer of the object detection network. During training, the control module 118 compares, for each set of historical defect repair conditions data, the predicted clean recipe (or repair recipe) to the actual historical reticle defect data associated with the reticle defect that resulted from those repair process conditions. The control module 118 also compares, for each set of historical reticle defect data, the predicted defect type to the actual historical reticle defect data associated with the reticle defect. The control module generates an error function indicating how closely the predicted defect type matches the historical reticle defect data. Similarly, the control module also generates an error function indicating how closely the predicted clean recipe (or repair recipe) data matches the historical defect repair conditions data. The control module 118 then adjusts the internal functions of the object detection network. Because the object detection network generates predicted clean recipe (or repair recipe) data based on the internal functions, adjusting the internal functions will result in the generation of different predicted clean recipe (or repair recipe) for a same set of historical defect repair conditions data. Adjusting the internal functions can result in predicted clean recipe (or repair recipe) data that produces larger error functions (worse matching to the historical reticle defect data 144) or smaller error functions (better matching to the historical reticle defect data 144). Similar process is performed for the predicted defect type data for training the AI model.

After adjusting the internal functions of the object detection network, the historical defect repair conditions data 146 is again passed to the object detection network and the analysis model 140 again generates predicted clean recipe (or repair recipe) data. The training module 141 again compares the predicted clean recipe (or repair recipe) data to the historical reticle defect data 144. The training module 141 again adjusts the internal functions of the object detection network. This process is repeated in a very large number of iterations of monitoring the error functions and adjusting the internal functions of the object detection network until a set of internal functions is found that results in predicted clean recipe (or repair recipe) data that matches the historical reticle defect data 144 across the entire training set.

At the beginning of the training process, the predicted clean recipe (or repair recipe) data likely will not match the historical reticle defect data 144 very closely. However, as the training process proceeds through many iterations of adjusting the internal functions of the object detection network, the errors functions will trend smaller and smaller until a set of internal functions is found that results in predicted clean recipe (or repair recipe) data that match the historical reticle defect data 144. Identification of a set of internal functions that results in predicted clean recipe (or repair recipe) data that matches the historical reticle defect data 144 corresponds to completion of the training process. Once the training process is complete, the object detection network is ready to be used to adjust reticle defect repair process parameters.

In one embodiment, after the analysis model 140 has been trained, the analysis model 140 can be utilized to generate sets of process conditions that will result in reticles having selected characteristics. For example, the control module 118 can provide the analysis model 140 with target reticle parameters corresponding to desired parameters of a defect free reticle (e.g., meets the specification). The target parameters can include a thickness of the defect, a composition of the defect, shape and structure of the defect, or other target parameters (e.g., location, size, length, width, depth, roughness, texture, etc.). As is set forth in more detail below, the analysis model 140 identifies a set of process parameters that will result in a reticle having the target parameters. In particular, the analysis model 140 generates process adjustment data indicating process parameters that should be utilized for the next reticle defect process or the next phase in the reticle defect process.

In one embodiment, the analysis model 140 utilizes current process parameter data to assist in generating process adjustment data. The current process parameter data includes data related to current conditions of repair processing equipment associated with the reticle repair processes. For example, the current process conditions data can include a current age of the repair apparatus. The current age of the repair apparatus can indicate one or both of an actual age of the repair apparatus and a number of reticle repair processes that have been performed with the repair apparatus. The current process parameter data can include remaining life of the repair apparatus. The current process conditions data can include data related to the type of materials such as etchings gas, deposition gas that will be utilized in the repair process.

The current process conditions data can include a roughness index of the surface of the reticle. Accordingly, the current process conditions data can include fixed conditions for the next reticle repair process. The current process conditions data can include many of the same types of data included in the historical defect repair conditions data 146.

In one embodiment, the analysis model 140 utilizes the current process conditions data and the target reticle parameter data in order to generate process adjustment data. The process adjustment data identifies process parameters that should be utilized for the next reticle repair process or for the next phase of a reticle repair process based on the current process conditions data and the target reticle parameter data. The process adjustment data corresponds to conditions or parameters that can be changed or adjusted for the next deposition process or next reticle repair process. Examples of parameters that may be adjusted include the flow rate of etching gas, the flow rate of deposition gas, the etch-stop gas flow, pattern-grow-gas flow, number of real-time defect repair images taken over a second (e.g., about 10 images or more per second), reticle etchant flow, the auto-dilution time of etching gas, the auto-dilution time of deposition gas, temperature within the repair apparatus, the pressure within the repair apparatus, the time duration of the repair process, or other aspects that can be dynamically adjusted between reticle repair processes or between phases of a reticle repair process. The analysis model 140 can identify values for these parameters that will result in a reticle having the target reticle parameters free of defect.

In one embodiment, the analysis model 140 generates process adjustment data by passing the current process conditions data to the analysis model 140. The analysis model 140 will then select trial values for dynamic process conditions that can be adjusted. The analysis model 140 will then generate predicted reticle defect data based on the current process conditions data and the trial values for dynamic process conditions. The predicted reticle defect data includes a predicted thickness, a predicted composition, a predicted structure, a predicted shape, a predicted size, a predicted roughness, a predicted length, width, depth, or other predicted characteristics of a reticle defect that would result from a reticle repair process based on the current process conditions data and the dynamic process conditions data. If the predicted reticle defect data falls within the target reticle defect parameters, then the analysis model 140 can generate process adjustment data specifying values for the dynamic process conditions data. The specified values will be utilized for the next reticle repair process or the next phase of the reticle repair process. If the predicted reticle defect data does not fall within the target reticle defect parameters, then the analysis model 140 selects other trial values for the dynamic process conditions data and generates predicted reticle defect data based on the new trial values. This process is repeated in iterations until values for the dynamic process conditions are found that result in predicted reticle defect data that falls within the target reticle defect parameters.

In one embodiment, because the analysis model 140 has been trained with a machine learning process that trains the analysis model 140 to generate reticle defect data based on process conditions data, the analysis model 140 is able to identify process adjustment data that will result in a reticle defect having parameters that fall within the target reticle defect parameters. The analysis model 140 can generate process adjustment data in a very short amount of time. For example, the analysis model 140 can generate process adjustment data in less than three seconds, though other values are possible without departing from the scope of the present disclosure. Accordingly, the analysis model 140 can be run between each reticle repair process or between each phase of a reticle repair process.

In one embodiment, the control module 118 includes processing resources 148, memory resources 150, and communication resources 152. The processing resources 148 can include one or more controllers or processors. The processing resources 148 are configured to execute software instructions, process data, make reticle repair control decisions, perform signal processing, read data from memory, write data to memory, and to perform other processing operations. The processing resources 148 can include physical processing resources 148 located at a site or facility of the reticle repair apparatus or system. The processing resources can include virtual processing resources 148 remote from the site reticle repair apparatus or a facility at which the reticle repair apparatus is located. The processing resources 148 can include cloud-based processing resources including processors and servers accessed via one or more cloud computing platforms.

In one embodiment, the memory resources 150 can include one or more computer readable memories. The memory resources 150 are configured to store software instructions associated with the function of the control module and its components, including, but not limited to, the analysis model 140. The memory resources 150 can store data associated with the function of the control module 118 and its components. The data can include the training set data 142, current process conditions data, and any other data associated with the operation of the control module 118 or any of its components. The memory resources 150 can include physical memory resources located at the site or facility of the reticle repair apparatus or system. The memory resources can include virtual memory resources located remotely from site or facility of the reticle repair apparatus or system. The memory resources 150 can include cloud-based memory resources accessed via one or more cloud computing platforms.

In one embodiment, the communication resources can include resources that enable the control module 118 to communicate with equipment associated with the reticle repair apparatus. For example, the communication resources 152 can include wired and wireless communication resources that enable the control module 118 to receive the sensor data associated with the reticle repair apparatus and to control equipment of the reticle repair apparatus. The communication resources 152 can enable the control module 118 to control the flow of etching gas, deposition gas or other material from the gas outlet of the repair apparatus. The communication resources 152 can enable the control module 118 to control other devices within the repair apparatus or communicatively coupled to the repair apparatus. The communication resources 152 can enable the control module 118 to communicate with remote systems. The communication resources 152 can include, or can facilitate communication via, one or more networks such as wire networks, wireless networks, the Internet, or an intranet. The communication resources 152 can enable components of the control module 118 to communicate with each other.

In one embodiment, the analysis model 140 is implemented via the processing resources 148, the memory resources 150, and the communication resources 152. The control module 118 can be a dispersed control system with components and resources and locations remote from each other and from the reticle repair apparatus.

Figure 8:
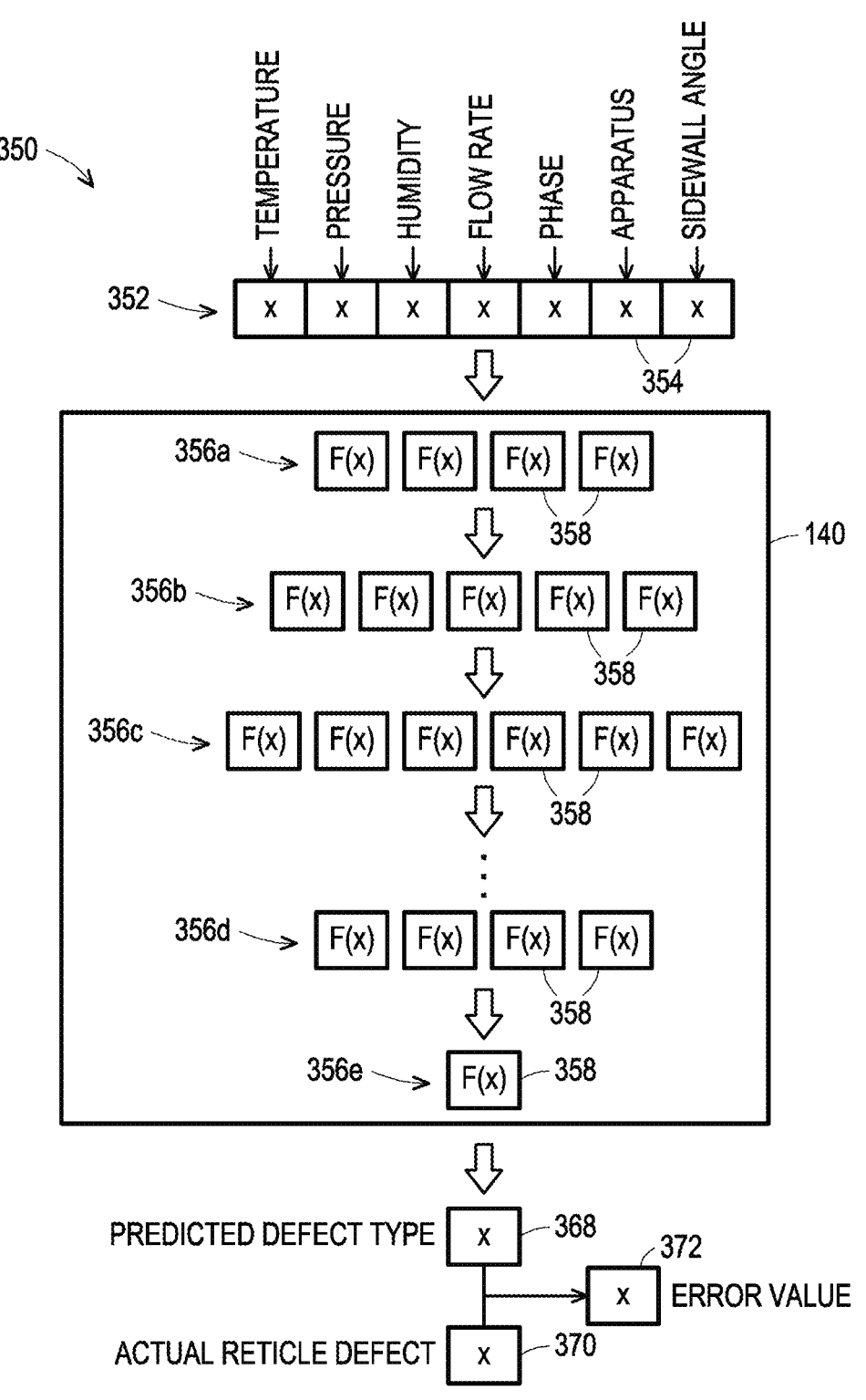
FIG. 8 is a block diagram illustrating operational aspects and training aspects of analysis model, according to one embodiment.

FIG. 8 is a block diagram 350 illustrating operational aspects and training aspects of analysis model 140, according to one embodiment. As described previously, the training set data 142 includes data (or parameters) related to a plurality of previously performed reticle repair processes. Each previously performed reticle repair process took place with particular process conditions and resulted in a reticle having a particular characteristics. The process conditions for each previously performed reticle repair process are formatted into a respective process conditions vector 352. The process conditions vector includes a plurality of data fields 354. Each data field 354 corresponds to a particular process condition.

The example of FIG. 8 illustrates a single process conditions vector 352 that will be passed to the analysis model 140 during the training process. In the example of FIG. 8, the process conditions vector 352 includes seven data fields 354. A first data field 354 corresponds to the temperature during the previously performed reticle repair process. A second data field 356 corresponds to the pressure during the previously performed reticle repair process. A third data field 354 corresponds to the humidity during the previously performed reticle repair process. The fourth data field 354 corresponds to the flow rate of etching or deposition materials during the previously performed reticle repair process. The fifth data field 354 corresponds to the phase (liquid, solid, or gas) of deposition materials during the previously performed reticle repair process. The sixth data field 354 corresponds to the age of the deflect repair apparatus used in the previously performed reticle repair process. The seventh data field 354 corresponds to the angle of sidewalls of surface features during the previously performed reticle repair process. In practice, each process conditions vector 352 can include more or fewer data fields than are shown in FIG. 8 without departing from the scope of the present disclosure. Each process conditions vector 352 can include different types of process conditions without departing from the scope of the present disclosure. The particular process conditions illustrated in FIG. 8 are given only by way of example. Each process condition is represented by a numerical value in the corresponding data field 354. For condition types that are not naturally represented in numbers, such as material phase, a number can be assigned to each possible phase.

The analysis model 140 includes a plurality of neural layers 356*a-e*. Each neural layer includes a plurality of nodes 358. Each node 358 can also be called a neuron. Each node 358 from the first neural layer 356*a* receives the data values for each data field from the process conditions vector 352. Accordingly, in the example of FIG. 8, each node 358 from the first neural layer 356*a* receives nine data values because the process conditions vector 352 has nine data fields. Each neuron 358 includes a respective internal mathematical function labeled F(x) in FIG. 8. Each node 358 of the first neural layer 356*a* generates a scaler value by applying the internal mathematical function F(x) to the data values from the data fields 354 of the process conditions vector 352. Further details regarding the internal mathematical functions F(x) are provided below.

Each node 358 of the second neural layer 356*b* receives the scaler values generated by each node 358 of the first neural layer 356*a*. Accordingly, in the example of FIG. 8 each node of the second neural layer 350 6B receives four scaler values because there are four nodes 358 in the first neural layer 356*a*. Each node 358 of the second neural layer 356*b* generates a scaler value by applying the respective internal mathematical function F(x) to the scalar values from the first neural layer 356*a*.

Each node 358 of the third neural layer 356*c* receives the scaler values generated by each node 358 of the second neural layer 356*b*. Accordingly, in the example of FIG. 8 each node of the third neural layer 356*c* receives five scaler values because there are five nodes 358 in the second neural layer 356*b*. Each node 358 of the third neural layer 356*c* generates a scaler value by applying the respective internal mathematical function F(x) to the scalar values from the nodes 358 of the second neural layer 356*b*.

Each node 358 of the neural layer 356*d* receives the scaler values generated by each node 358 of the previous neural layer (not shown). Each node 358 of the neural layer 356*d* generates a scaler value by applying the respective internal mathematical function F(x) to the scalar values from the nodes 358 of the previous neural layer 356*b*.

The final neural layer includes only a single node 358. The final neural layer receives the scalar values generated by each node 358 of the previous neural layer 356*d*. The node 358 of the final neural layer 356*e* generates a data value 368 by applying a mathematical function F(x) to the scaler values received from the nodes 358 of the neural layer 356*d*.

In the example of FIG. 8, the data value 368 corresponds to the predicted thickness of a thin film generated by process conditions data corresponding to values included in the process conditions vector 352. In other embodiments, the final neural layer 356*e* may generate multiple data values each corresponding to a particular reticle defect characteristic such as reticle defect shape, reticle defect dimension, or other characteristics of a reticle defect. The final neural layer 356*e* will include a respective node 358 for each output data value to be generated. In the case of a predicted reticle defect type, engineers can provide constraints that specify that the predicted reticle defect type 368 includes certain dimension features such as the thickness having a selected range, such as between 0 nm and 50 nm, in one example. The analysis model 140 will adjust internal functions F(x) to ensure that the data value 368 corresponding to the certain reticle defect type falls within the specified range to identify the appropriate reticle defect type.

The training of the analysis model 140 can be more fully understood by discussing the internal mathematical functions F(x). While all of the nodes 358 are labeled with an internal mathematical function F(x), the mathematical function F(x) of each node is unique. In one example, each internal mathematical function has the following form:

$$F(x)=x_1 {}^* w_1 + x_2 {}^* w_2 + \ldots x_n {}^* w_n + b.$$

In the equation above, each value $x_1$-$x_n$ corresponds to a data value received from a node 358 in the previous neural layer, or, in the case of the first neural layer 356*a*, each value $x_1$-$x_n$ corresponds to a respective data value from the data fields 354 of the process conditions vector 352. Accordingly, n for a given node is equal to the number of nodes in the previous neural layer. The values $w_1$-$w_n$ are scalar weighting values associated with a corresponding node from the previous layer. The analysis model 140 selects the values of the weighting values $w_1$-$w_n$. The constant b is a scalar biasing value and may also be multiplied by a weighting value. The value generated by a node 358 is based on the weighting values $w_1$-$w_n$. Accordingly, each node 358 has n weighting values $w_1$-$w_n$. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 372 has been calculated, the analysis model 140 adjusts the weighting values $w_1$-$w_n$ for the various nodes 358 of the various neural layers 356*a*-356*e*. After the analysis model 140 adjusts the weighting values $w_1$-$w_n$, the analysis model 140 again provides the process conditions vector 352 to the input neural layer 356*a*. Because the weighting values are different for the various nodes 358 of the analysis model 140, the predicted thickness 368 will be different than in the previous iteration. The analysis model 140 again generates an error value 372 by comparing the actual defect type 370 to the predicted defect type 368.

The analysis model 140 again adjusts the weighting values $w_1$-$w_n$ associated with the various nodes 358. The analysis model 140 again processes the process conditions vector 352 and generates a predicted defect type 368 and associated error value 372. The training process includes adjusting the weighting values $w_1$-$w_n$ in iterations until the error value 372 is minimized.

A particular example of a neural network based analysis model 140 has been described in relation to FIG. 8. However, other types of neural network including object detection network based analysis models, or analysis models of types other than neural networks can be utilized without departing from the scope of the present disclosure. Furthermore, the neural network can have different numbers of neural layers having different numbers of nodes without departing from the scope of the present disclosure.

Figure 9:
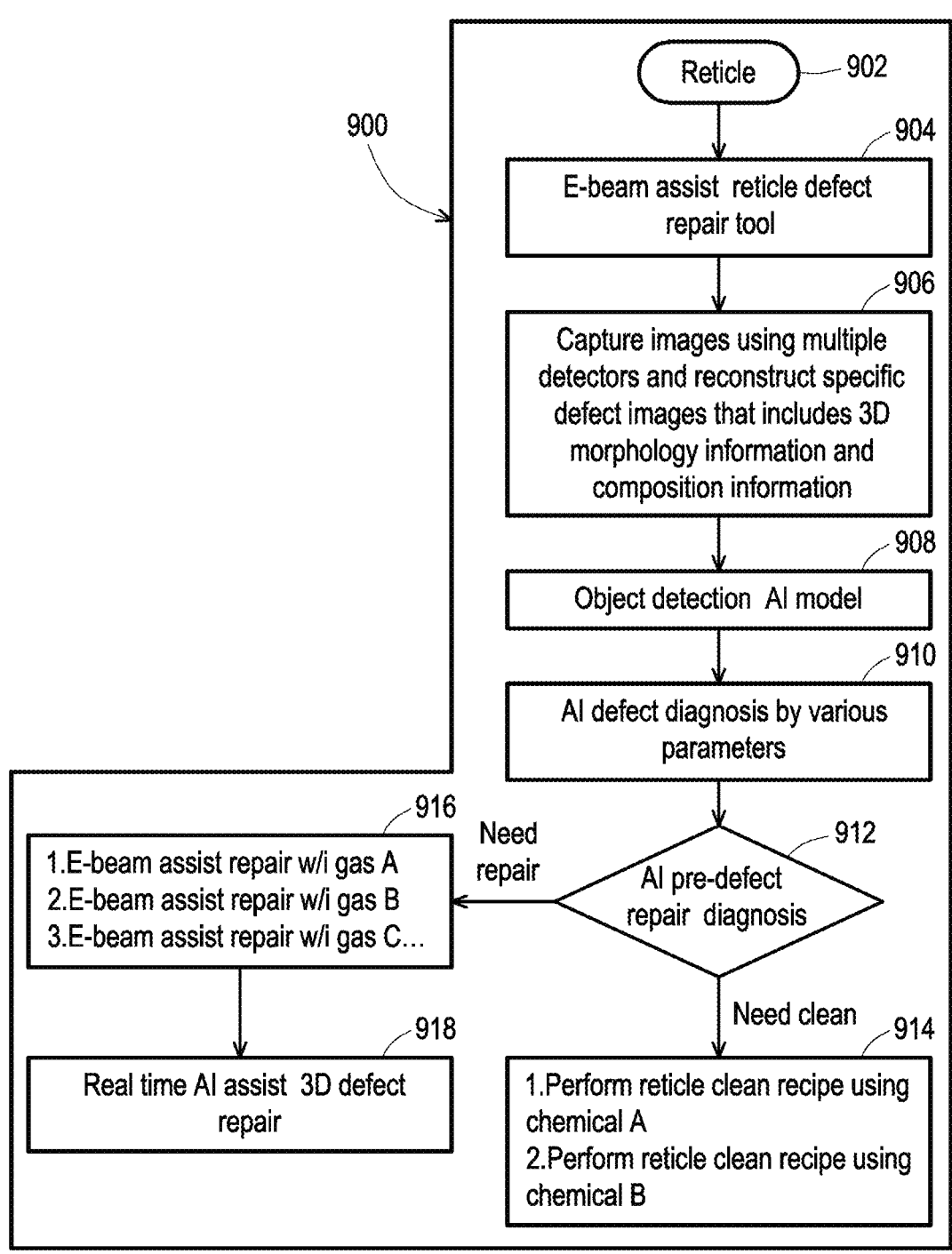
FIG. 9 is a flow diagram of a process for reticle repair process, according to one embodiment.

FIG. 9 is a flow diagram of a process 900 for reticle repair process, according to one embodiment. The various steps of the process 900 can utilize components, processes, and techniques described previous figures.

In step 902, a reticle is provided. In step 904, an e-beam AI assisted reticle defect repair apparatus 300 receives the reticle. In step 906, the reticle defect repair apparatus 300 captures various images of the reticle using the first to fourth detectors 310-340 which contain morphology information and composition information. In one embodiment, the specific defect image is reconstructed in a 3D image that contains morphology information and composition information of the reticle defect. In some embodiments, the reticle defect repair apparatus 300 may capture the various images using the detectors when an accelerate voltage of the e-beam is set at about 1 keV and another set of images using the detectors when an accelerate voltage of the e-beam is set at about 3 keV. The 1 keV setting can provide morphology information and composition information regarding the surface of the reticle and the defect and the 3 keV setting can provide morphology information and composition information regarding the deeper surface of the reticle and the defect.

In step 908, the object detection AI model such as YOLO is used to detect objects within the image. In this case, the YOLO model is trained as explained in connection with FIGS. 7 and 8, and is capable of detecting the reticle defect and identify its defect type with high probability (e.g., providing accuracy above 90%). In step 910, the controller 118 or the AI module included in the controller 118 conducts the analysis based on the parameters obtained from previously provided training images from the reticle engineer. These parameters include critical dimensions of the reticle, the size, shape, location, roughness, depth, height, length, width of known reticle defect types, as well as other properties associated with the reticle defect.

In step 912, the controller performs the diagnosis and determines whether the reticle requires either a clean or a repair. If the controller determines that reticle needs cleaning rather than a repair, the controller will provide signals to the apparatus so disperse a chemical used for cleaning the surface of the reticle. In step 914, a suitable cleaning chemical is provided for each unique reticle cleaning condition. If the controller determines that reticle needs repairing rather than cleaning, the controller will provide signals to the apparatus to provide either an etching gas or a deposition gas to repair the reticle. In step 916, the controller provides suitable gas as well as the flow rate and the cycle time of the gas flow so that over-etching of the reticle does not happen. In step 918, the real-time repairing process can be monitored to detect the reduction rate of the thickness of the defect and control the concentration of the etching gas, for example, by diluting the amount of etching gas provided in the apparatus as the repair process gets closer to an end. The auto-dilution of the gas ensures that the surface of the reticle will not be damaged by the over-etching.

One or more embodiments of the present disclosure describe an artificial intelligence assisted substrate defect repair apparatus and method. The AI assisted defect repair apparatus employs an object detection algorithm. Based on the plurality of images taken by detectors located at different respective positions, the detectors capture various views of an object including a defect. The composition information as well as the morphology information (e.g., shape, size, location, height, depth, width, length, or the like) of the defect and the object are obtained based on the plurality of images. The object detection algorithm analyzes the images and determines the type of defect and the recommends a material (e.g., etching gas, deposition gas) and the associated information (e.g., supply time of the etching gas, flow rate of the etching gas, etc.) for fixing the defect. The AI assisted defect repair apparatus allows to quickly identify the various defect types found in the reticle and provide a solution for that particular type of reticle defect. For example, for a reticle defect "A," the apparatus may return a clean recipe (or repair recipe) "A" that includes information about which repair gas such as etchant gas or deposition gas be used, and the flow rate and the duration of the repair gas to avoid over-etching of the reticle, and a real-time monitoring of the thickness change of the reticle defect to obtain the highest probability to remove the defect without damaging the reticle, etc.

Further embodiments of the present disclosure includes a system. The system includes a defect repair apparatus configured to examine and repair surfaces of a substrate. The system includes a processor. The system includes a communication device communicatively coupling the defect repair apparatus and the processor. The communication device is configured to transmit signals generated from the processor to the defect repair apparatus.

In some embodiments, the defect repair apparatus includes a first, second, and third detectors. The first detector is configured to obtain a first view of the surfaces of the substrate based on a reflected signal generated from a signal source. The second detector is configured to obtain a second view of the surfaces of the substrate different from the first view based on the reflected signal. The third detector is configured to obtain a third view of the surfaces of the substrate different from the first and second views based on the reflected signal.

In some embodiments, the processor is configured to receive the first, second, and third views from the first, second, and third detectors, respectively. The processor is configured to analyze the first view of the surfaces of the substrate, analyze the second view of the surfaces of the substrate, analyze the third view of the surfaces of the substrate, and generate a three dimensional view of the surfaces of the substrate based on the first, second, and third views.

The first and second views include views generated based on secondary electrons included in the reflected signal, and the third view include a view generated based on backscattered electrons included in the reflected signal.

Further embodiments of the present disclosure include a method. The method includes obtaining one or more images of an object based on a plurality of detectors positioned at respective locations. The one or more images of the object includes one or more defect images. The method includes identifying a defect type based on the defect images of the object. The method includes determining a type of material for repairing the defect type. The method includes repairing the defect of the object using the determined material. The defect images include morphology information and composition information of the object and the defect.

Further embodiments of the present disclosure include an apparatus. The apparatus includes a signal source configured to emit light signal to an object. The apparatus includes a first detector positioned at a first location configured to receive a first signal reflected from the object. The apparatus includes a second detector positioned at a second location configured to receive a second signal reflected from the object. The apparatus includes a third detector positioned at a third location configured to receive a third signal reflected from the object. The apparatus includes a fourth detector positioned at a fourth location configured to receive a fourth signal reflected from the object.

In some embodiments, the apparatus includes an AI assisted controller. The controller is configured to: analyze the first signal to produce a first image of the object including a defect on the object, analyze the second signal to produce a second image of the object including the defect on the object, analyze the third signal to produce a third image of the object including the defect on the object, and analyze the fourth signal to produce a fourth image of the object including the defect on the object.

Here, the first, second, and third signals include signals from secondary electrons radiated from the object upon light signal emitted from the signal source opposite of the object contacts the object.

The controller includes artificial intelligence assisted object detection algorithms such as the YOLO model.

Further embodiment of the present disclosure includes an apparatus. The apparatus comprising: a signal source configured to emit light signal to an object; a first detector positioned at a first location configured to receive a first signal reflected from the object; a second detector positioned at a second location configured to receive a second signal reflected from the object; a third detector positioned at a third location configured to receive a third signal reflected from the object; a fourth detector positioned at a fourth location configured to receive a fourth signal reflected from the object; and a controller configured to: analyze the first signal to produce a first image of the object including a defect on the object; analyze the second signal to produce a second image of the object including the defect on the object; analyze the third signal to produce a third image of the object including the defect on the object; and analyze the fourth signal to produce a fourth image of the object including the defect on the object, wherein the first, second, and third signals include signals from secondary electrons radiated from the object upon light signal emitted from the signal source opposite of the object contacts the object, and wherein the controller includes artificial intelligence assisted object detection algorithms.

In some embodiments, the fourth signal includes signal from backscattered electrons radiated from the object upon light signal emitted from the signal source opposite of the object contacts the object.

In some embodiments, the fourth signal includes composition information of the object and the defect and the first, second, and third signals include morphology information of the object and the defect.

In some embodiments, the controller is further configured to: determine morphology information of the defect based on the first, second, third images of the object; determine composition information of the defect based on the fourth image of the object; and identify a defect type based on the first, second, third, and fourth images of the object.

In some embodiments, the controller is further configured to: determine morphology information of the defect based on the first, second, third images of the object; determine composition information of the defect based on the fourth image of the object; and identify a defect type based on the first, second, third, and fourth images of the object, wherein the artificial intelligence assisted object detection algorithms include a YOLO (You Only Look Once) model.

In some embodiments, the controller is further configured to: determine a type of material for repairing the defect type based on the morphology information and the composition information; and request repairing the defect of the object using the determined material.

In some embodiments, the morphology information includes information based on about 10 to 20% from the first detector, about 10 to 20% from the second detector, about 20 to 30% from the third detector, and about 40 to 50% from the fourth detector.

In some embodiments, the signal source is operated at an accelerate voltage at about 1 keV to produce the first, second, third, and fourth images.

In some embodiments, the signal source is further operated at another accelerate voltage at about 3 keV to produce the first, second, third, and fourth images.

In some embodiments, the controller is configured to: analyze both the first, second, third, and fourth images obtained at the signal source having accelerate voltage at about 1 keV and the first, second, third, and fourth images obtained at the signal source having accelerate voltage at about 3 keV; determine the morphology information and composition information of the defect; and determine a type of material for repairing the defect type based on the morphology information and the composition information.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

emitting a first electron beam toward an object on a semiconductor substrate, the first electron beam emitted at a first accelerate voltage;

emitting a second electron beam toward the object on the semiconductor substrate, the second electron beam emitted at a second accelerate voltage, the second accelerate voltage being higher than the first accelerate voltage;

obtaining one or more images of the object on the semiconductor substrate based on the first accelerate voltage and the second accelerate voltage and a plurality of detectors positioned at respective locations, the one or more images of the object including one or more reticle defect images, wherein each reticle defect image is an image depicting at least one reticle defect of the object, and wherein each reticle defect image includes morphology information and composition information of the object and the at least one reticle defect;

analyzing the one or more images of the object on the semiconductor substrate with one or more artificial intelligence assisted object detection algorithms of a control module, wherein the control module includes a training module of training set data, an analysis model, memory resources, processing resources, and communication resources, and analyzing the one or more images of the object on the semiconductor substrate including: identifying a reticle defect type based on the one or more reticle defect images of the object;

performing a defect diagnosis by various parameters with the one or more artificial intelligence assisted object detection algorithms of the control module including:

generating a predicted reticle defect data, wherein the predicted reticle defect data includes a predicted thickness, a predicted composition, a predicted structure, a predicted shape, a predicted size, a predicted roughness, or a predicted length, width, and depth; and comparing the predicted reticle defect data with a target reticle defects data, wherein the target reticle defects data includes parameters of a defect-free reticle;

performing a pre-defect repair diagnosis with the control module including determining whether a reticle cleaning process is performed or a reticle repair process is performed;

when the reticle repair process is determined to be performed in performing the pre-defect repair diagnosis, the reticle repair process is performed including:

determining a type of gas for repairing the reticle defect type by the control module;

adjusting process conditions by the control module for the reticle repair process based on the results of analyzing the one or more images of the object on the semiconductor substrate;

repairing the at least one reticle defect of the object using the adjusted process conditions, wherein the adjusted process conditions are determined to be predictive, and repairing the at least one reticle defect includes selectively supplying the type of gas, wherein the type of gas is at least one of a deposition gas or an etching gas, and wherein, when the type of gas is determined to be the etching gas, the etching gas is diluted in real-time based on at least one of the morphology information and composition information to avoid over-etching of underlying structures underneath the reticle defect;

when the reticle cleaning process is determined to be performed in performing the pre-defect repair diagnosis, the reticle cleaning process is performed including:

determining a type of cleaning chemical for cleaning the reticle defect type by the control module; and performing a cleaning recipe on the reticle with the type of cleaning chemical.

2. The method of claim 1, wherein obtaining one or more images of an object based on a plurality of detectors positioned at respective locations includes:

receiving a first signal reflected from the object at a first detector among the plurality of detectors positioned at a first location;

receiving a second signal reflected from the object at a second detector among the plurality of detectors positioned at a second location; and receiving a third signal reflected from the object at a third detector among the plurality of detectors positioned at a third location, wherein the third location is opposite the object.

3. The method of claim 2, wherein the first, second, and third signals include signals from secondary electrons radiated from the object upon signals emitted from a signal source opposite of the object contacts the object.

4. The method of claim 3, wherein the first, second, and third signals include morphology information of the object.

5. The method of claim 3, wherein the first detector is laterally positioned from the object and the second detector is vertically positioned from the object, wherein the first location of the first detector is closer to the object than the second location of the second detector.

6. The method of claim 3, wherein receiving the first signal reflected from the object at the first detector among the plurality of detectors positioned at the first location includes:

receiving the first signal at the first detector at a first angle from a plane in which the object is on, the first angle being between about 0 degrees and about 45 degrees.

7. The method of claim 3, wherein the second signal reflected from the object at the second detector among the plurality of detectors positioned at a second location includes:

receiving the second signal at the second detector at a second angle from a plane in which the object is on, the second angle being between about 45 degrees and about 75 degrees.

8. The method of claim 2, wherein obtaining one or more images of the object based on the plurality of detectors positioned at the respective locations includes:

receiving a fourth signal reflected from the object at a fourth detector among the plurality of detectors positioned at a fourth location, wherein the fourth signal includes composition information of the object, and wherein the fourth detector and the third detector are adjacently arranged, and the fourth location of the fourth detector is opposite the object.

9. The method of claim 8, wherein the fourth signal includes a signal from backscattered electrons radiated from the object upon respective signals emitted from a signal source opposite of the object contacts the object.

10. The method of claim 1, wherein the predicted reticle defect data further includes predicted morphology information and predicted composition information of the object are obtained based on the one or more artificial intelligence assisted object detection algorithms.

11. The method of claim 10, wherein the one or more artificial intelligence assisted object detection algorithms include a YOLO (You Only Look Once) model.

12. The method of claim 1, wherein the first accelerate voltage of the electron beam is 1 keV and the second accelerate voltage of the electron beam is 3 keV.

13. A method comprising:

obtaining one or more images of an object on a semiconductor substrate based on a plurality of detectors positioned at respective locations, wherein the one or more images of the object includes one or more reticle defect images, and each reticle defect image is an image depicting at least one reticle defect of the object, and the one or more reticle defect images include morphology information and composition information of the object and the at least one reticle defect, and wherein obtaining one or more images of the object based on the plurality of detectors positioned at respective locations further includes:

receiving a first signal reflected from the object and a backscattered electron signal at a first detector positioned opposite of the object;

analyzing the one or more images of the object on the semiconductor substrate with one or more artificial intelligence assisted object detection algorithms of a control module, wherein the control module includes a training module of training set data an analysis model, memory resources, processing resources, and communication resources, and analyzing the one or more images of the object on the semiconductor substrate including: identifying a reticle defect type based on the one or more reticle defect images of the object;

performing a defect diagnosis by various parameters with the one or more artificial intelligence assisted object detection algorithms of the control module including: generating a predicted reticle defect data, wherein the predicted reticle defect data includes a predicted thickness, a predicted composition, a predicted structure, a predicted shape, a predicted size, a predicted roughness, or a predicted length, width, and depth; comparing the predicted reticle defect data with a target reticle defects data, wherein the target reticle defects data includes parameters of a defect-free reticle; and performing a pre-defect repair diagnosis with the control module including determining whether a reticle cleaning process is performed or a reticle repair process is performed;

when the reticle repair process is determined to be performed in performing the pre-defect repair diagnosis, the reticle repair process is performed including: determining a type of gas for repairing the reticle defect type by the control module;

adjusting process conditions by the control module for a reticle repair process based on the results of analyzing the one or more images of the object on the semiconductor substrate;

repairing the reticle defect of the object using the adjusted process conditions, wherein the adjusted process conditions are determined to be predictive, and repairing the at least one reticle defect includes selectively supplying the type of gas, wherein the type of gas is at least one of a deposition gas or an etching gas, and wherein, when the type of gas is determined to be the etching gas, the etching gas is diluted in real-time based on at least one of the morphology information and composition information of the at least one reticle defect;

when the reticle cleaning process is determined to be performed in performing the pre-defect repair diagnosis, the reticle cleaning process is performed including: determining a type of cleaning chemical for cleaning the reticle defect type by the control module; and performing a cleaning recipe on the reticle with the type of cleaning chemical, and wherein the composition information of the object and the at least one reticle defect being obtained from the backscattered electron signal received by the first detector.

14. The method of claim 13, wherein receiving the signal reflected from the object includes morphology information of the object and the at least one reticle defect.

15. The method of claim 13, wherein determining the type of gas for repairing the reticle defect type includes: determining the type of gas for repairing the reticle defect type based on the morphology information and the composition information.

16. The method of claim 13, wherein obtaining one or more images of an object on a semiconductor substrate based on a plurality of detectors positioned at respective locations includes: obtaining one or more plan view images.

17. The method of claim 13, wherein receiving the first signal reflected from the object includes receiving secondary electrons radiated from the object upon a light signal emitted from a signal source opposite of the object.

18. The method of claim 13, wherein obtaining one or more images of an object based on a plurality of detectors positioned at respective locations includes:

receiving a second signal reflected from the object at a second detector positioned laterally from the object at a first inclination angle;

receiving a third signal reflected from the object at a third detector positioned laterally from the object at a second inclination angle, the second inclination angle being greater than the first inclination angle; and receiving a fourth signal reflected from the object at a fourth detector positioned opposite of the object.

19. A method comprising:

obtaining one or more images of an object on a semiconductor substrate based on a plurality of detectors positioned at respective locations, the one or more images of the object including one or more reticle defect images, wherein each reticle defect image is an image depicting at least one reticle defect of the object, wherein the one or more reticle defect images include morphology information and composition information of the object and the at least one reticle defect, and the obtaining one or more images of the object based on the plurality of detectors includes:

receiving a first signal reflected from the object at a first detector;

receiving a second signal reflected from the object at a second detector;

receiving a third signal reflected from the object at a third detector; and receiving a fourth signal reflected from the object and a backscattered electron signal at a fourth detector;

analyzing the one or more images of the object on the semiconductor substrate with one or more artificial intelligence assisted object detection algorithms of a control module, wherein the control module includes a training module of training set data, an analysis model, memory resources, processing resources, and communication resources, and analyzing the one or more images of the object on the semiconductor substrate including: identifying a reticle defect type based on the one or more reticle defect images of the object;

performing a defect diagnosis by various parameters with the one or more artificial intelligence assisted object detection algorithms of the control module including: generating a predicted reticle defect data, wherein the predicted reticle defect data includes a predicted thickness, a predicted composition, a predicted structure, a predicted shape, a predicted size, a predicted roughness, or a predicted length, width, and depth; comparing the predicted reticle defect data with a target reticle defects data, wherein the target reticle defects data includes parameters of a defect-free reticle;

performing a pre-defect repair diagnosis with the control module including determining whether a reticle cleaning process is performed or a reticle repair process is performed;

when the reticle repair process is determined to be performed in performing the pre-defect repair diagnosis, the reticle repair process is performed including: determining a type of material for repairing the reticle defect type by a control module, wherein the control module includes training module of training set data, analysis model, memory resources, processing resources, and communication resources;

adjusting process conditions by the control module for a reticle repair process based on the results of analyzing the one or more images of the object on the semiconductor substrate; and repairing the at least one reticle defect of the object using the adjusted process conditions, wherein the adjusted process conditions are determined to be predictive, and repairing the at least one reticle defect includes selectively supplying the type of gas, wherein the type of gas is at least one of a deposition gas or an etching gas, and wherein, when the type of gas is determined to be the etching gas, the etching gas is diluted in real-time based on at least one of the morphology information and composition information of the at least one reticle defect;

when the reticle cleaning process is determined to be performed in performing the pre-defect repair diagnosis, the reticle cleaning process is performed including:

determining a type of cleaning chemical for cleaning the reticle defect type by the control module; and performing a cleaning recipe on the reticle with the type of cleaning chemical, and wherein the composition information obtained from the backscattered electron signal, and the backscattered electron signal accounting for at least 40 percent of the morphology and composition information obtained for the object and the at least one reticle defect.

20. The method of claim 19, wherein adjusting process conditions includes a concentration of the etching gas, an amount of the deposition gas, duration, or temperature in response to the real-time.

\* \* \* \* \*